US010103045B2

(12) United States Patent
Liu et al.

(10) Patent No.: US 10,103,045 B2
(45) Date of Patent: Oct. 16, 2018

(54) VERTICAL FIXING TRANSMISSION BOX AND TRANSMISSION METHOD USING THE SAME

(71) Applicant: GUDENG PRECISION INDUSTRIAL CO., LTD, New Taipei (TW)

(72) Inventors: Kuan-Chun Liu, New Taipei (TW); Wei-Yen Chen, New Taipei (TW); Chia-Ho Chuang, New Taipei (TW); Ming-Chien Chiu, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 0 days.

(21) Appl. No.: 15/385,017

(22) Filed: Dec. 20, 2016

(65) Prior Publication Data

US 2018/0102269 A1    Apr. 12, 2018

(30) Foreign Application Priority Data

Oct. 7, 2016    (TW) .............................. 105132480 A

(51) Int. Cl.
*H01L 21/673*    (2006.01)
*H01L 21/677*    (2006.01)

(52) U.S. Cl.
CPC .... *H01L 21/67379* (2013.01); *H01L 21/6773* (2013.01); *H01L 21/67359* (2013.01); *H01L 21/67376* (2013.01); *H01L 21/67389* (2013.01); *H01L 21/67733* (2013.01)

(58) Field of Classification Search
CPC ........ B65D 25/04; B65D 85/00; B65D 85/30; H01L 21/67; H01L 21/673; H01L 21/67359; H01L 21/67369; H01L 21/67376; H01L 21/67379; H01L 21/67386; H01L 21/67389; H01L 21/677; H01L 21/67733; H01L 21/6773
USPC ......................................... 206/454, 710, 711
See application file for complete search history.

(56) References Cited

U.S. PATENT DOCUMENTS

| | | | |
|---|---|---|---|
| 5,390,785 A | 2/1995 | Garric et al. | |
| 8,403,143 B2 | 3/2013 | Chiu et al. | |
| 9,097,980 B2 | 8/2015 | Ku et al. | |
| 9,881,820 B2* | 1/2018 | Wong ............... | H01L 21/67167 |
| 2007/0211232 A1 | 9/2007 | Phillips et al. | |
| 2018/0019142 A1* | 1/2018 | Wong ............... | H01L 21/68707 |

(Continued)

FOREIGN PATENT DOCUMENTS

| | | |
|---|---|---|
| TW | I382948 B | 1/2013 |
| TW | I411563 B | 10/2013 |
| TW | I430929 B | 3/2014 |

*Primary Examiner* — Bryon Gehman
(74) *Attorney, Agent, or Firm* — Muncy, Geissler, Olds & Lowe, P.C.

(57) ABSTRACT

A vertical fixing transmission box used for transmitting a container is disclosed. The transmission box includes a carrier substrate and an elastic component, wherein the carrier substrate is utilized to carry the container, and the elastic component may be switched between an opening state and a fixing state. When the container is carried by the carrier substrate and the elastic component is switched to the opening state, the elastic component provides a vertical elastic force to abut against the container downwardly and fix the container. Also, the transmission box may be transported by an automatic material handling system.

15 Claims, 8 Drawing Sheets

(56) References Cited

U.S. PATENT DOCUMENTS

2018/0040492 A1* 2/2018 Wong .............. H01L 21/68707
2018/0068879 A1* 3/2018 Wong .............. H01L 21/68707

* cited by examiner

VERTICAL FIXING TRANSMISSION BOX AND TRANSMISSION METHOD USING THE SAME

CROSS REFERENCE TO RELATED APPLICATION

This application claims the benefits of the Taiwan Patent Application Serial Number 105132480, filed on Oct. 7, 2016, the subject matter of which is incorporated herein by reference.

BACKGROUND OF THE INVENTION

1. Field of the Invention

The present invention relates to a vertical fixing transmission box and transmission method using the same. More specifically, the present invention relates to a transmission box utilized to carry a container and the transmission method using the transmission box with the automatic material handling system.

2. Description of Related Art

Optical lithography plays an important role in the semiconductor industry, which has been developed rapidly. In the optical lithography process, the pre-designed patterns are fabricated into a reticle with specific forms, then; the light emitted from the light source passes through the reticle and is projected on a silicon wafer to expose the specific patterns on the silicon wafer according to the principle of exposure. However, due to the miniaturization development of the semiconductor industry, any kind of dust particles that adhere to the reticle may result in quality degradation of projected pattern, therefore, the reticle used to produce patterns on the silicon wafer is required to be absolutely dust-free. Accordingly, the reticle is usually operated in a clean room environment to prevent contamination.

In a typical reticle transmitting process, the reticle is placed in a reticle pod to prevent contamination of dust particles since the reticle pod is an airtight box. Typically, the reticle is placed in the reticle box and the reticle box is transferred manually by operators to the next stage of the manufacturing process. However, the size of the silicon wafer has reached to 12-inches or larger, thus, the volume and the weight of the reticle also increase with the size of the silicon wafer. It will be inevitable that the reticle pod may drop and cause serious safety issues to those operators and loss of cost from the damaged reticles if the reticle pod is transmitted manually.

In order to solve the aforementioned problems, the computer integrated automatic material handling system of the wafer factory may be applied for transmission of the reticle pods with its mechanical arms. Hence, the reticle pod may be transmitted in a safe and fast way, and the manual operation error may be decreased so that the cost of clean room construction and maintenance may be reduced. Also, the cleanliness of the reticle may be guaranteed to achieve high production yield for effective factory management.

SUMMARY OF THE INVENTION

To achieve the object mentioned above, the present invention provides a transmission box for transmitting a reticle pod and a transmission method using the transmission box. A vertical fixing element is disposed inside the transmission box to firmly fix the reticle pod inside the transmission box. The overhead lifting system disposed above the transmission box may coordinate with the automatic material handling system to transmit the transmission box automatically.

The transmission box provided by the present invention is utilized for transmitting a container, the transmission box comprises: a front-opening box body comprising a top portion, a bottom portion opposing the top portion, a right side portion, a left side portion, a rear side portion, an opening opposing the rear portion, and an interior space; wherein the top portion, the bottom portion, the right side portion, the left side portion, and the rear side portion define the interior space; a door body for sealing the opening of the front-opening box body; a carrier substrate disposed inside the interior space and on the bottom portion for carrying the container; and an elastic component disposed inside the interior space and connected to the top portion and operationally converted between an opening state and a fixing state; wherein the elastic component is compressed in the opening state; the elastic component is released and provides a vertical elastic force in the fixing state. When the container is carried by the carrier substrate and the elastic component is switched to the opening state, the elastic component provides the vertical elastic force to abut against the container downwardly and fix the container.

In one embodiment of the present invention, the transmission box further comprises a fixing element, which is disposed in the interior space and matches with the elastic component, the fixing element fixes the container's position when the container is carried by the carrier substrate.

In one embodiment of the present invention, the carrier substrate comprises a carrying plate and a plurality of carrying feet; wherein the carrying plate has a flange bump for fixing the container, and the carrying feet are disposed on a bottom surface of the carrying plate and abut against the bottom portion of the front-opening box body.

In one embodiment of the present invention, the elastic component may comprise a spring; an inner tube disposed in the interior space and fixed to the top portion of the front-opening box body, and the inner tube slips over at least a portion of the spring; an outer tube movably slips over the inner tube; at least one latch member and at least one sliding slot corresponding to the at least one latch member; wherein the at least one latch member and the at least one sliding slot are disposed on an outer surface of the inner tube or an inner surface of the outer tube respectively, the at least one latch member movably slides along the sliding slot, and a first stop slot is disposed at one end of the sliding slot; and an abutting member disposed below the outer tube and corresponding to the container; wherein the elastic component is in the opening state when the at least one latch member moves to the first stop slot; the elastic component provides the vertical elastic force to abut against the container from above the container when the at least one latch member moves to the sliding slot.

According to the aforementioned transmission box, the transmission box further comprises a second stop slot disposed at one end of the sliding slot opposing the first stop slot; wherein the second stop slot includes a via hole, and the outer tube and the inner tube are separated when the at least one latch member moves through the second stop slot and reaches the via hole.

In another embodiment of the present invention, the elastic component further comprises a spring; an inner tube movably slips over at least a portion of the spring; an outer tube disposed in the interior space and fixed to the top portion of the front-opening box body, and the outer tube slips over at least a portion of the inner tube; at least one latch member and at least one sliding slot corresponding to the at least one latch member; wherein the at least one latch member and the at least one sliding slot are disposed on an outer surface of the inner tube and an inner surface of the outer tube respectively, the at least one latch member movably slides along the at least one sliding slot, and a first stop slot is disposed at one end of the at least one sliding slot; and an abutting member disposed at one end of the at least one sliding slot; and an abutting member disposed below the inner tube and corresponding to the container; wherein the elastic component being in an opening state when the at least one latch member moves to the first slot; the elastic component provide the vertical elastic force to abut against the container from above the container when the at least one latch member moves to the at least one sliding slot.

According to the aforementioned transmission box, the transmission box further comprises a second stop slot disposed at one end of the at least one sliding slot opposing the first stop slot; wherein the second stop slot includes a via hole, and the outer tube and the inner tube are separated when the at least one latch member moves through the second stop slot and reaches the via hole.

In one embodiment of the present invention, the transmission box may further comprise an overhead host transfer joint, which is disposed above the front-opening box body.

In another embodiment of the present invention, the transmission box may further comprise at least one sensing device, which is disposed in the interior space of the front-opening box body. The sensing device comprises at least one selected from the group consisting of a temperature sensing element, a humidity sensing element, a pressure sensing element, and a vibration sensing element.

In one another embodiment of the present invention, at least one inflating hole the front-opening box body is formed at the bottom portion of the front-opening box body. Besides, a hollow structure may be formed at least one selected from the rear side portion, the left side portion, and the right side portion.

It is another object of the present invention to provide a transmission method for transmitting a container using the transmission box described above. The transmission method comprises the steps of: placing a container on the carrier substrate; switching the elastic component to the fixing state from the opening state to fix the container; closing the door body to seal the opening of the front-opening box body; and transmitting the transmission box using an automatic material handling system.

In one embodiment of the present invention, the elastic component comprises an inner tube, an outer tube movably slips over the inner tube, and a spring disposed in the inner tube and the outer tube; wherein the step of fixing the container comprises: adjusting the related positions of the outer tube and the inner tube for switching the elastic component to the fixing state from the opening state to fix the container.

In another embodiment of the present invention, the transmission box further comprises an overhead host transfer joint, which is disposed above the front-opening box body; wherein the step of transmitting the transmission box using an automatic material handling system comprises: using a mechanical arm to grab the overhead host transfer joint for transmitting the transmission box.

DETAILED DESCRIPTION OF THE PREFERRED EMBODIMENT

Hereafter, examples will be provided to illustrate the embodiments of the present invention. Advantages and effects of the invention will become more apparent from the disclosure of the present invention. It should be noted that these accompanying figures are simplified and illustrative. The quantity, shape and size of components shown in the figures may be modified according to practical conditions, and the arrangement of components may be more complex. Other various aspects also may be practiced or applied in the invention, and various modifications and variations can be made without departing from the spirit of the invention based on various concepts and applications.

Figure 1:
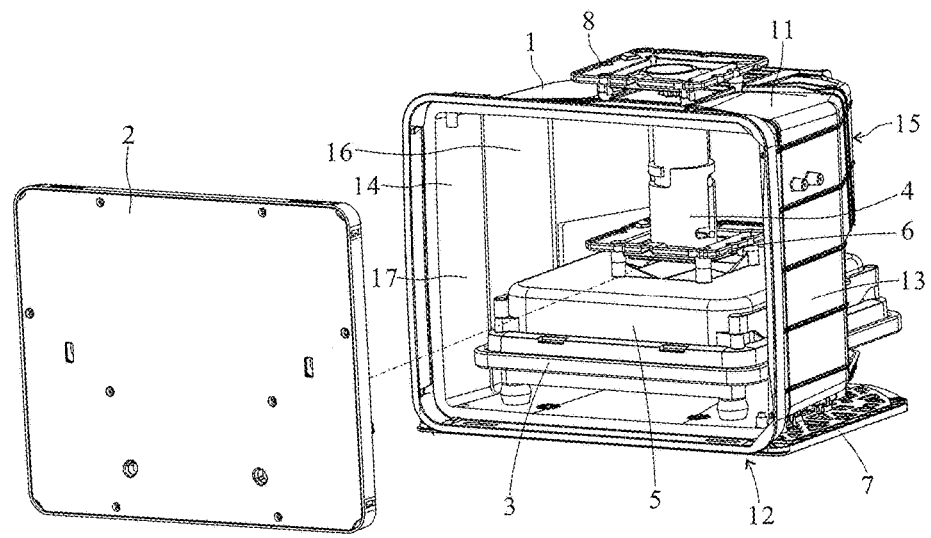
FIG. 1 is a 3-dimentional view of the transmission box of one embodiment of the present invention.
Figure 2:
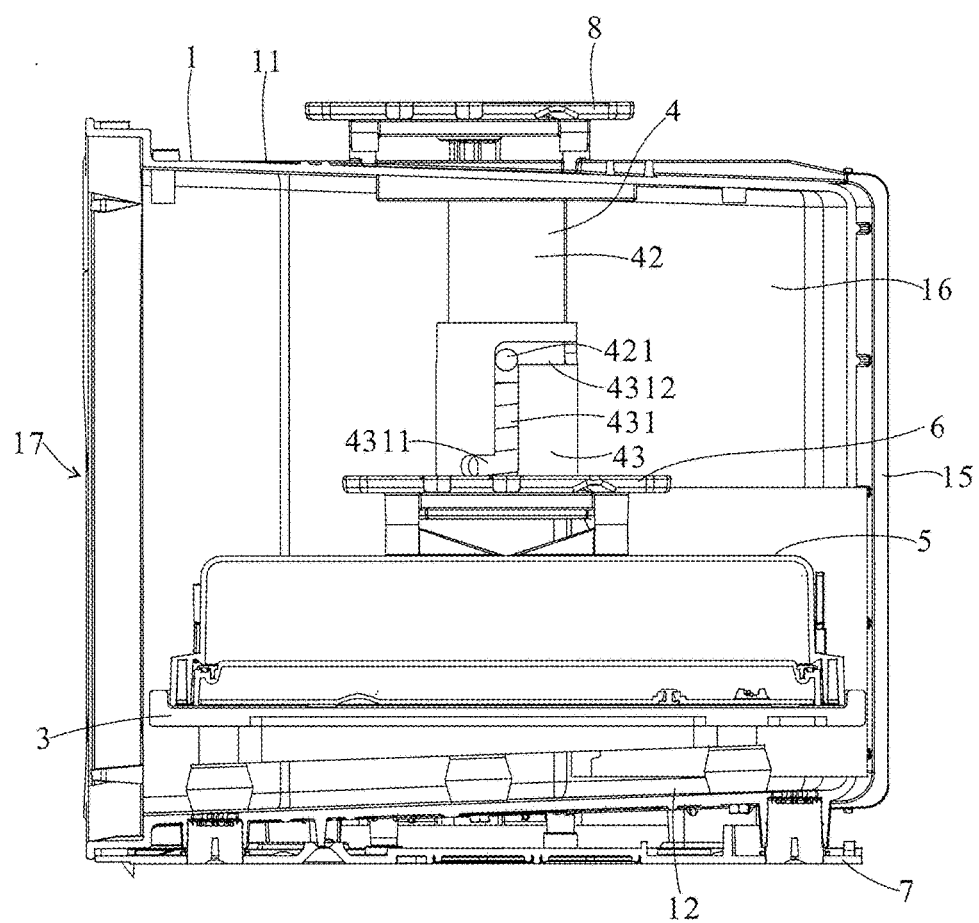
FIG. 2 is a cross-section view of the transmission box of one embodiment of the present invention.

Firstly, please refer to FIG. 1 and FIG. 2 simultaneously; wherein FIG. 1 illustrates the perspective view of the transmission box 1000 of the present invention, FIG. 2 illustrates the cross-section view of the transmission box 1000 of the present invention. As illustrated, the transmission box 1000 comprises a front-opening box body 1, a door body 2, a carrier substrate 3, and an elastic component 4. The front-opening box 1 has a top portion 11, a bottom portion 12 opposing to the top portion 11, a right side portion 13, a left side portion 14, and a rear side portion 15 so that an interior space 16 is formed inside the front-opening box body 1, and an opening 17 opposing the rear side portion 15. The door body 2 may seal the opening 17. The carrier substrate 3 is disposed in the interior space 16 and on the bottom portion 12 for carrying a container 5; the elastic component 4 is disposed in the interior space 16 and connected to the top portion 11, and may operationally convert between an opening state and a fixing state. The elastic component 4 is compressed in the opening state (refer to FIG. 5), and the elastic component 4 is released and provides a vertical elastic force in the fixing state (refer to FIG. 1). When the container 5 is placed on the carrier substrate 3 and the elastic component 4 is in the fixing state, the elastic component 4 provides a vertical elastic force to abut against the container 5 from above the container 5.

In the present embodiment, the container 5 refers to a reticle pod that containing the reticle. However, the container 5 of the present invention is not limited to the reticle pod, and can be any types of container in this technical field.

A locking device (not shown in figures) is disposed on the door body 2 of the present invention to firmly lock the door body 2 to the opening 17 of the front-opening box body 1.

In the present invention, the locking device may be any types of locking device known in the art without particular limitations, such as press or rotary locking device, as long as the locking device is able to secure and fix the door body 2 to the opening 17 of the front-opening box body 1.

In addition, as illustrated in the figures, the transmission box 1000 of the present invention may further comprise a fixing element 6, which is disposed above the container 5 and matches with the elastic component 4. When the container 5 is placed on the carrier substrate 3, the position of the container 5 may be fixed by the fixing element 6, and the fixing element 6 may engage to the elastic component 4 with a notch formed on the fixing element 6 corresponding to the elastic component 4 for securing the position of the force that applied on and avoiding replacement between the elastic component 4 and the container 5.

Moreover, with reference to the figures, the transmission box 1000 may further comprise a base 7 disposed under the front-opening box body 1 for supporting the front-opening box body 1. Also, due to the preparation method of the front-opening box body 1 (such as the stripping step of the injection molding), the bottom portion 12 of the front-opening box body 1 may be formed with an inclined surface, therefore, there is an angle between the base 7 and the bottom portion 12 to maintain the horizontal level of the front-opening box body 1.

Figure 3:
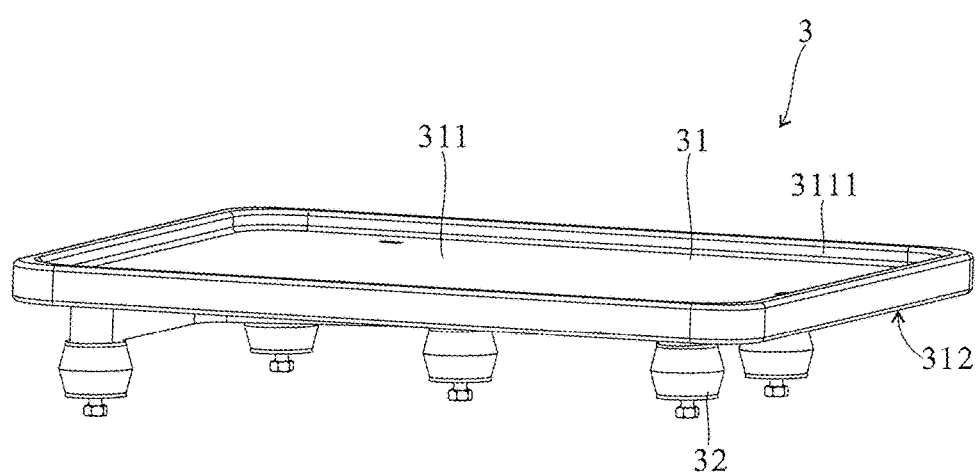
FIG. 3 is a 3-dimentional view of the carrier substrate in the transmission box of one embodiment of the present invention.

In addition, please refer to FIG. 3, which illustrates the 3-dimentional view of the carrier substrate 3. In detail, the carrier substrate 3 includes a carrying plate 31 and a plurality of carrying feet 32. The carrying plate 31 has a top surface 311 and a bottom surface 312; wherein the top surface 311 of the carrying plate 31 has a flange bump 3111 that conforms the contour of the container 5 so that the position of the container 5 may be fixed to avoid horizontal displacement when the container 5 is placed on the carrying plate 31. Five carrying feet 32 are disposed on the bottom surface 312 of the carrying plate 31 that abut against the bottom portion 12 of the front-opening box body 1. The carrying feet 32 are formed preferably by elastic materials to provide the damping effect. In addition, the bottom portion of the front-opening box body 1 may have an inclined surface due to its manufacturing method; therefore, the bottom surface 312 of the carrying plate 31 may be formed with an inclined angle, or the distances between each of the carrying feet and the bottom surface 312 of the carrying plate 31 may be adjusted to keep the horizontality of the top surface 311 of the carrying plate 31 and the horizontality of the container 5 placed on the carrying plate 31. Furthermore, the shape of the flange bump 3111 of the carrying plate 31 is not particularly limited and may be a continuous flange bump or a discontinuous flange bump as long as the shape of the flange bump may conform the contour of the container 5 and the position of the container 5 may be fixed to avoid the horizontal displacement. The number of the carrying feet 32 is not particularly limited as long as the carrier substrate 3 may be firmly disposed on the bottom portion 12 of the front-opening box body 1 to stably carry the container 5. However, the number of the carrying feet 32 is preferably larger than three.

Figure 4:
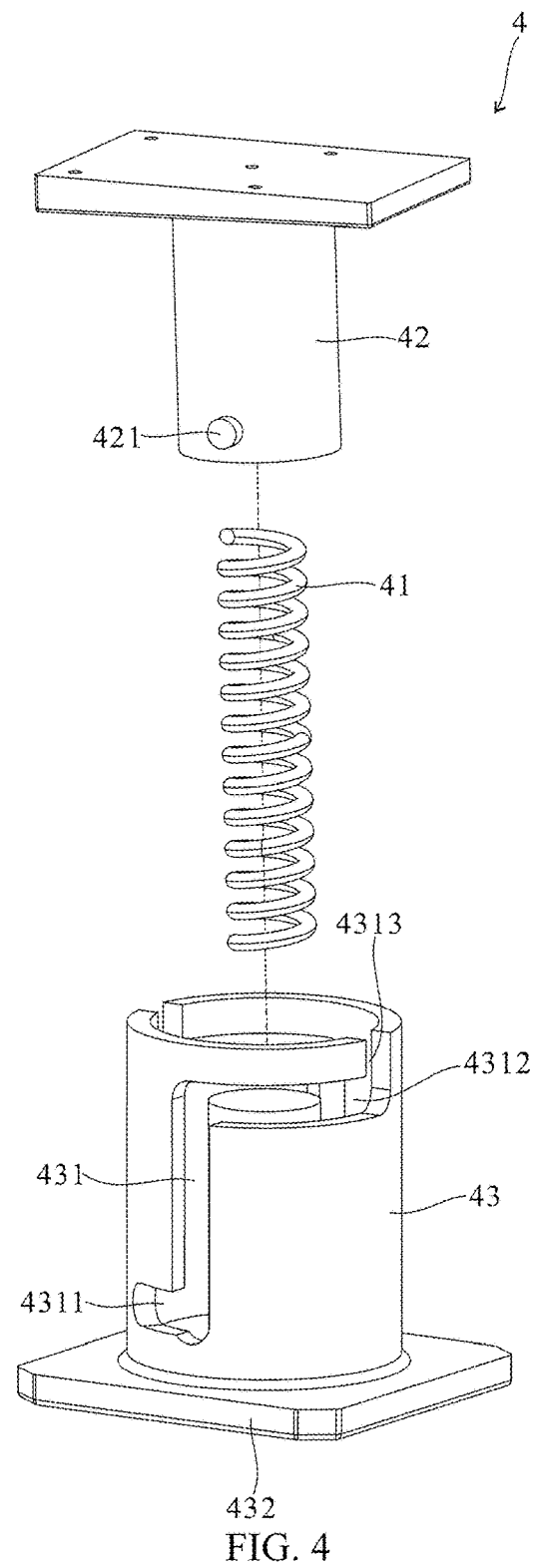
FIG. 4 is an explosion diagram of the elastic component in the transmission box of one embodiment of the present invention.

Please refer to FIG. 4, which illustrates the explosion diagram of the elastic component 4, the elastic component 4 comprises: a spring 41, an inner tube 42, an outer tube 43, a latch member 421, and a sliding slot 431 corresponding to the at least one latch member 421, and an abutting member 432. The inner tube 42 is fixed to the top portion 11 of the front-opening box body 1; the inner tube 42 slips over at least a portion of the spring 41; and the outer tube movably slips over the inner tube 42. As illustrated, the at least one latch member is disposed on the outer surface of the inner tube 42 and the at least one sliding slot 431 is disposed on the inner surface of the outer tube 43 correspondingly so that the at least one latch member 421 may movably slide along the at least one sliding slot 431. Also, the first stop slot 4311 is disposed at one end of the at least one sliding slot 431 away from the top portion 11 of the front-opening box body 1; and the second stop slot 4312 is disposed at one end of the at least one sliding slot 431 opposing the first stop slot 4311; wherein the second stop slot 4312 includes a via hole 4313. Further, the abutting member 432 is disposed below the outer tube 43 corresponding to the container 5.

Please refer to the elastic component 4 illustrated in FIG. 2, which illustrates the fixing state of the elastic component 4. The elastic component 4 provides the vertical elastic force to abut against the container 5 from above the container 5 when the at least one latch member 421 moves to the at least one sliding slot 431. In addition, when the container 5 is not placed in the front-opening box body 1, the at least one latch member 421 may slide through the second stop slot 4312 to reach the via hole 4313 to separate the inner tube 42 and the outer tube 43. Accordingly, the outer tube 43 may be replaced when needed.

Figure 5:
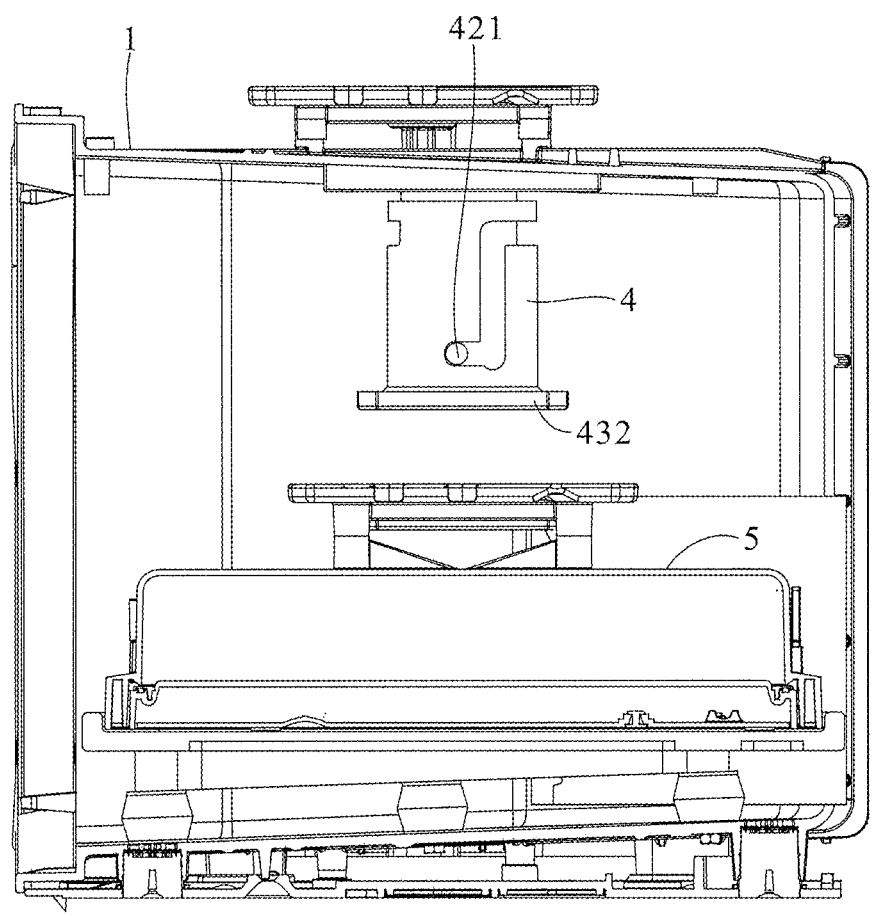
FIG. 5 is a schematic diagram of the elastic component in its opening state of one embodiment of the present invention.

Please refer to FIG. 5, which illustrates the opening state of the elastic component 4. In this case, the at least one latch member 421 slides to the first stop slot 4311 to fix the corresponding position between the outer tube 43 and the inner tube 42, the outer tube 43 slips over most of the inner tube 42, and the spring 41 is compressed. When the elastic component 4 is in the opening state, the container 5 may be put into or removed from the transmission box 1000.

Figure 6:
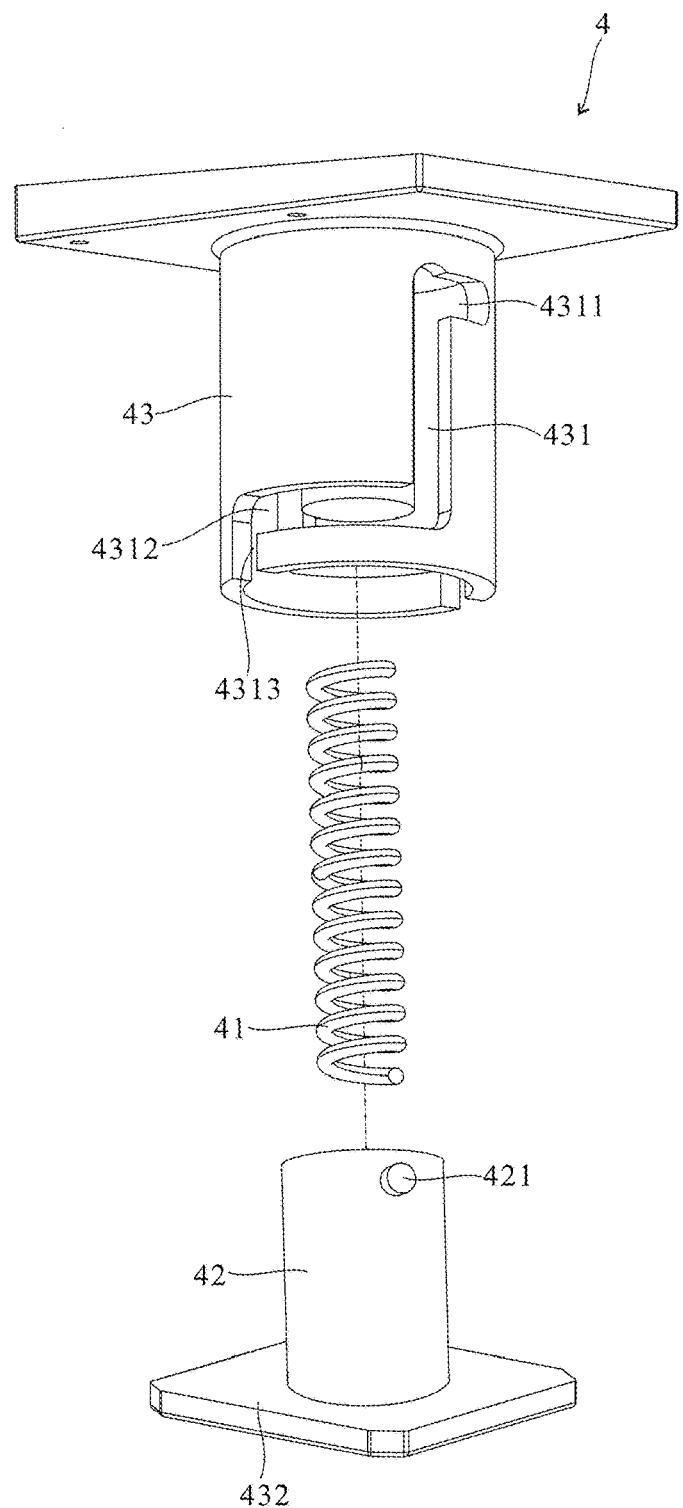
FIG. 6 is a schematic diagram of the elastic component in the transmission box on another embodiment of the present invention.

However, refer to the elastic component 4 of another embodiment, the positions of the outer tube 43 and the inner tube 42 are exchanged. As illustrated in FIG. 6, the outer tube 43 is fixed to the top portion 12 of the front-opening box body 1, the inner tube 42 slips over a portion of the spring 41, the outer tube 43 is movably slips over the inner tube 42, and the abutting member 432 is disposed below the outer tube 42 to abut against the container 5. In addition, the first stop slot 4311 is disposed at one end of the at least one sliding slot 431 away from the top portion 11 of the front-opening box body 1; moreover, a second stop slot 4312 and a via hole 4313 connected to the second stop slot 4312 are disposed at another end of the at least one sliding slot 431. As illustrated, the at least one latch member 421 is disposed on the outer surface of the inner tube 42 and the at least one sliding slot 431 is disposed correspondingly on the inner surface of the outer tube 43 so that the at least one latch member 421 may movably slide in the at least one sliding slot 431.

However, the elastic component 4 may be any types of elastic component in this field that is able to provide a vertical elastic force to abut against the container downwardly without particular limitation.

Moreover, the transmission box 1000 of the present invention further comprises an overhead host transfer joint 8 (OHT joint) that disposed above the front-opening box body 1. Please refer to FIG. 1, the OHT joint 8 is a rectangular plate with protruded peripheral edges. Mainly, the wafers are transmitted using the wafer handling box in the factories manufacturing the wafer larger than 12 inches. However, the wafer handling box cannot be easily transported by the operators due to the weight of the wafer handling box carrying the wafers. Therefore, the transmission of the wafer is usually operated by the automatic material handling system with the mechanical arm to grab the protruded peripheral edges of the overhead host transfer joint to carry the wafer handling box. In the present invention, the OHT joint 8 disposed above the front-opening box body 1 exhibit the same function that can be grabbed and carry by the corresponding mechanical arm. Further, in the present invention, the size and the shape of the OHT joint 8 are not particularly limited as long as the OHT joint 8 is applicable to the mechanical arm. The method of disposing the OHT joint 8 above the front-opening box body 1 is not particularly limited, which can be the fixation methods using screws or latches.

Figure 7:
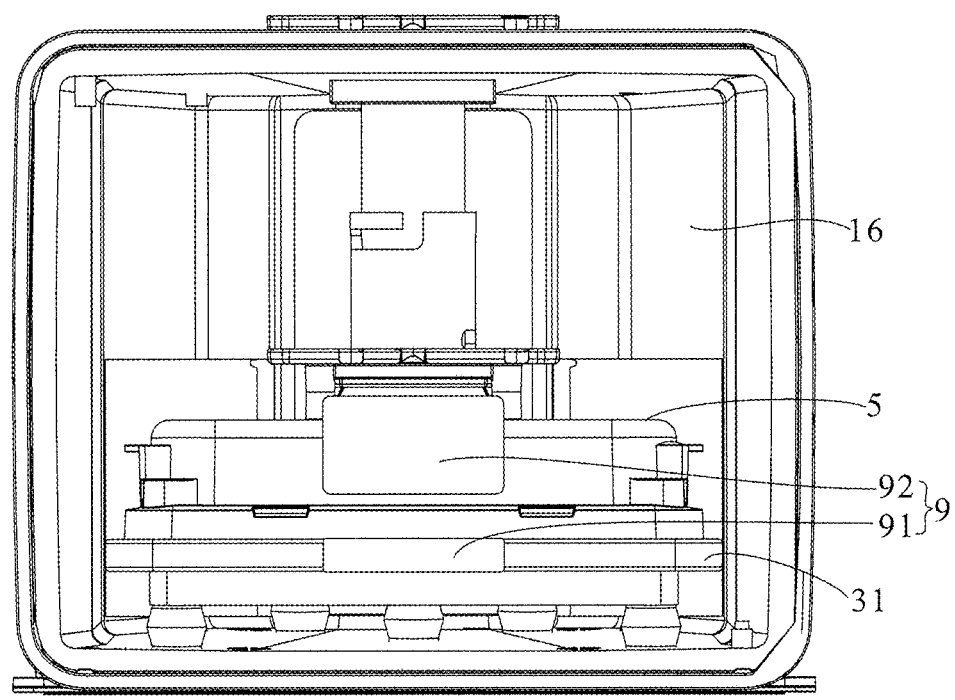
FIG. 7 is a schematic diagram of disposing the sensing device in the transmission box of one embodiment of the present invention.

In addition, the transmission box 1000 may further comprise at least one sensing device 9, which may be disposed in the interior space 16 of the front-opening box body 1 to immediately monitor environmental changes of the transmission box 1 such as the temperature, humidity, pressure, or vibration. Accordingly, the sensing device 9 may comprise at least one selected from the group consisting of a temperature sensing element, a humidity sensing element, a pressure sensing element, and a vibration sensing element. The location of the sensing device in the interior space 16 of the front-opening box body 1 is not particularly limited which can be designed as needed. For example, as illustrated in FIG. 7, the sensing device 9 comprising the vibration sensing element 91 (vibration sensing device) may be disposed on the carrying plate 31 for monitoring the vibration condition of the container 5 that being placed thereon. Also, the sensing device 9 comprising the temperature sensing element 92 (temperature sensing device) may be disposed in the interior space 16 of the front-opening box body 1 for monitoring the temperature of the interior space 16. The sensing device 9 may comprise plural sensing elements simultaneously if needed, such as the sensing device comprising the temperature sensing element and the humidity sensing element so that the sensing device may monitor the temperature and the humidity inside the transmission box 1 at the same time. Furthermore, these sensing devices 9 may transfer the detected data to the cloud and real-time monitoring system through wireless transmission.

Figure 8:
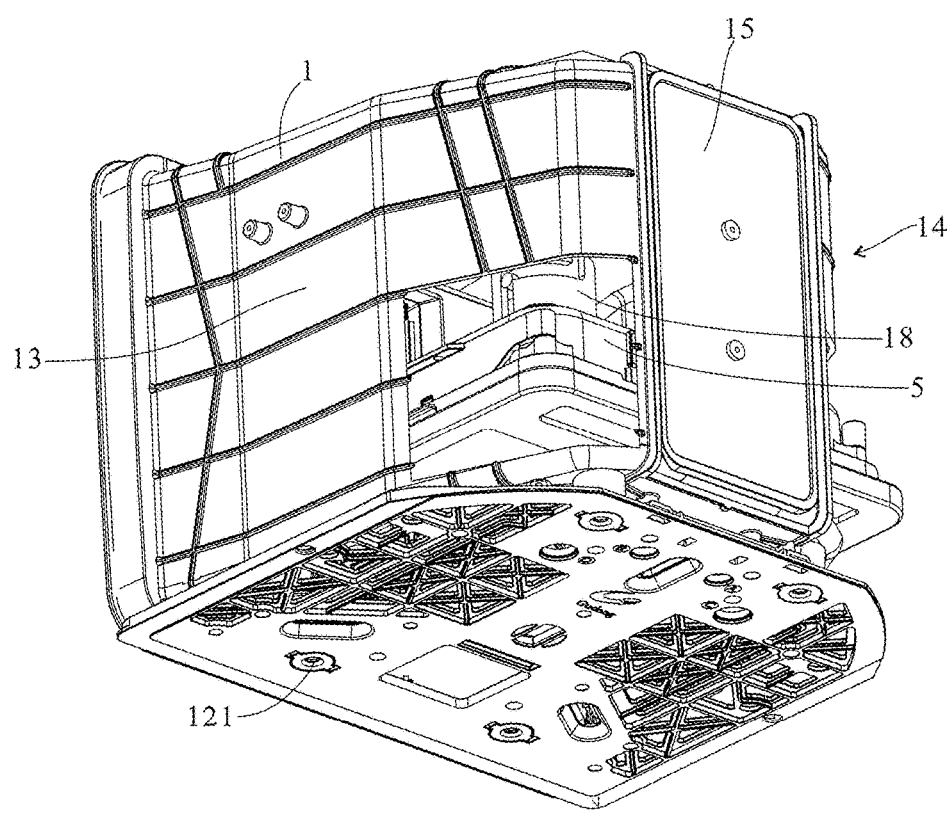
FIG. 8 is a bottom view of the transmission box of one embodiment of the present invention.

Please refer to FIG. 8, which illustrates the bottom view of the transmission box 1000 of the present invention. Four inflating holes are formed at the bottom of the transmission box 1000, through which the nitrogen gas is inflated for cleaning the interior of the transmission box 1000. In addition, as illustrated in FIG. 8, the connected surface between the rear side portion 15 and the left side portion 14 or the right side portion 13 of the front-opening box body 1 may be formed as a hollow structure 18. Accordingly, a portion of the container 5 may protrude out from the transmission box 1000 through the hollow structure 18 if the size of the container 5 is too large. However, the hollow structure 18 may be formed as needed, for example, the hollow structure is not needed if the size of the container 5 is not too large and the container 5 is able to be contained in the transmission box. The hollow structure 18 may be formed in plural spaced holes or a long-shaped hollow structure without any particular limitation.

Moreover, the transmission method for transmitting a container using the transmission box the will be described in the following description. First, switch the elastic component of the transmission box to its opening state, and then, place the container on the carrier substrate and fix the position of the container by the flange bump of the carrying plate. Then, rotate the outer tube of the elastic component to adjust the relative position between the outer tube and the inner tube until the at least one latch member on the inner tube slides from the first stop slot to the at least one sliding slot. When the elastic component is switched to the fixing state from the opening state, the spring of the elastic component provides the elastic force to abut against the fixing element downwardly through the abutting component underneath the outer tube to fix the container vertically. The door body is then closed to seal the opening of the front-opening box body; and transmitting the transmission box using an automatic material handling system, which utilizes the mechanical arm to grab the OHT joint above the front-opening to transmit the transmission box.

The transmission box provided in the present invention may carry the reticle pod that containing the reticle and transmit the transmission box with the automatic material handling system that originally equipped in the wafer factory; therefore, the disadvantages of manual handling may be avoided, the production yield may be improved, and the factory management may also be improved.

Although the present invention has been explained in relation to its preferred embodiment, it is to be understood that many other possible modifications and variations can be made without departing from the spirit and scope of the invention as hereinafter claimed.

What is claimed is:

1. A transmission box for transmitting a container, comprising:
   a front-opening box body comprising a top portion, a bottom portion opposing the top portion, a right side portion, a left side portion, a rear side portion, an opening opposing the rear side portion and an interior space, wherein the top portion, the bottom portion, the right side portion, the left side portion and the rear side portion define the interior space;
   a door body for sealing the opening of the front-opening box body;
   a carrier substrate disposed inside the interior space and on the bottom portion for carrying the container; and
   an elastic component disposed inside the interior space and connected to the top portion and operationally converted between an opening state and a fixing state, wherein the elastic component is compressed in the opening state, and the elastic component is released and provides a vertical elastic force in the fixing state;
   wherein when the container being carried by the carrier substrate and the elastic component being switched to the opening state, the elastic component provides the vertical elastic force to abut against the container downwardly and fix the container.

2. The transmission box as claimed in claim 1, further comprising a fixing element, which is disposed in the interior space and matches with the elastic component, the fixing element fixes the container's position when the container is carried by the carrier substrate.

3. The transmission box as claimed in claim 1, wherein the carrier substrate comprises a carrying plate and a plurality of carrying feet, and
   wherein the carrying plate has a flange bump for fixing the container, and the carrying feet are disposed on a bottom surface of the carrying plate and abut against the bottom portion of the front-opening box body.

4. The transmission box as claimed in claim 1, wherein the elastic component comprising:
   a spring;
   an inner tube disposed in the interior space and fixed to the top portion of the front-opening box body, and the inner tube slips over at least a portion of the spring;
   an outer tube movably slipping over the inner tube;

at least one latch member and at least one sliding slot corresponding to the at least one latch member, wherein the least one latch member and the at least one sliding slot are disposed on an outer surface of the inner tube or an inner surface of the outer tube respectively, the at least one latch member movably slides along the at least one sliding slot, and a first stop slot is disposed at one end of the at least one sliding slot; and an abutting member disposed below the outer tube;

wherein, the elastic component is in the opening state when the at least one latch member moves to the first stop slot; the elastic component provides the vertical elastic force to abut against the container from above the container when the at least one latch member moves to the at least one sliding slot.

5. The transmission box as claimed in claim 4, further comprising a second stop slot disposed at one end of the at least one sliding slot opposing the first stop slot, wherein the second stop slot includes a via hole, and the outer tube and the inner tube being separated when the at least one latch member moves through the second stop slot and reaches the via hole.

6. The transmission box as claimed in claim 1, wherein the elastic component comprising:

a spring;

an inner tube movably slips over at least a portion of the spring;

an outer tube disposed in the interior space and fixed to the top portion of the front-opening box body, and the outer tube slips over at least a portion of the inner tube;

at least one latch member and at least one sliding slot corresponding to the at least one latch member, wherein the at least one latch member and the at least one sliding slot are disposed on an outer surface of the inner tube or an inner surface of the outer tube respectively, the at least one latch member movably slides along the at least one sliding slot, and a first stop slot is disposed at one end of the at least one sliding slot; and an abutting member disposed below the outer tube;

wherein the elastic component being in an opening state when the latch member moves to the first stop slot; the elastic component provides the vertical elastic force to abut against the container from above the container when the latch member moves to the sliding slot.

7. The transmission box as claimed in claim 6, further comprising a second stop slot disposed at one end of the at least one sliding slot opposing the first stop slot, wherein the second stop slot includes a via hole, and the outer tube separates the inner tube when the at least one latch member moves through the second stop slot and reaches the via hole.

8. The transmission box as claimed in claim 1, further comprising an overhead host transfer joint, which is disposed above the front-opening box body.

9. The transmission box as claimed in claim 1, further comprising at least one sensing device, which is disposed in the interior space of the front-opening box body.

10. The transmission box as claimed in claim 9, wherein the at least one sensing device comprises at least one selected from the group consisting of a temperature sensing element, a humidity sensing element, a pressure sensing element, and a vibration sensing element.

11. The transmission box as claimed in claim 1, wherein at least one inflating hole is formed at the bottom portion of the front-opening box body.

12. The transmission box as claimed in claim 1, wherein at least one selected from the rear side portion, the left side portion, and the right side portion is formed as a hollow structure.

13. A transmission method for transmitting a container using the transmission box as claimed in claim 1 which comprises the steps of:

placing a container on the carrier substrate;

switching the elastic component to the fixing state from the opening state to fix the container;

closing the door body to seal the opening of the front-opening box body; and transmitting the transmission box using an automatic material handling system.

14. The transmission method as claimed in claim 13, wherein the elastic component comprises an inner tube, an outer tube movably slips over the inner tube, and a spring disposed in the inner tube and the outer tube, and wherein the step of fixing the container comprising:

adjusting the related positions of the outer tube and the inner tube for switching the elastic component to the fixing state from the opening state to fix the container.

15. The transmission method as claimed in claim 13, wherein the transmission box further comprises an overhead host transfer joint, which is disposed above the front-opening box body, and wherein the step of transmitting the transmission box using an automatic material handling system comprising:

using a mechanical arm to grab the overhead host transfer joint for transmitting the transmission box.

* * * * *